United States Patent [19]

Mattox

[11] Patent Number: 5,043,302

[45] Date of Patent: Aug. 27, 1991

[54] GLASSY BINDER SYSTEM FOR CERAMIC SUBSTRATES, THICK FILMS AND THE LIKE

[75] Inventor: Douglas M. Mattox, Pittsburgh, Pa.

[73] Assignee: The United States of America as represented by the Secretary of the Navy, Washington, D.C.

[21] Appl. No.: 172,838

[22] Filed: Mar. 25, 1988

[51] Int. Cl.$^5$ .......................... C03C 8/14; C03C 8/02
[52] U.S. Cl. ....................... 501/17; 501/15; 501/32; 501/52
[58] Field of Search ..................... 501/15, 17, 32, 52

[56] References Cited

U.S. PATENT DOCUMENTS

| 3,510,325 | 5/1970 | Broener et al. | 501/52 |
|---|---|---|---|
| 3,673,092 | 6/1972 | Dietz | 501/32 |
| 3,706,582 | 12/1972 | Meyer | 501/17 |
| 4,065,743 | 12/1977 | Wahlers et al. | 501/17 |
| 4,291,107 | 9/1981 | Barry et al. | 501/52 |
| 4,341,849 | 7/1982 | Park et al. | 501/52 |
| 4,547,467 | 10/1985 | Barth et al. | 501/17 |
| 4,593,006 | 6/1986 | Takabatake et al. | 501/32 |
| 4,624,934 | 11/1986 | Kokubu et al. | 501/17 |

OTHER PUBLICATIONS

Douglas M. Mattox, "Contamination-Nucleated Crystal Growth at Bubble Surfaces in Glass", 12/67 The American Ceramic Society, vol. 50, No. 12, p. 683.

A. E. Owen, "Properties of Glasses in the System $CaO-B_2O_3-Al_2O_3$", 6/61, Physics & Chem. of Glasses vol. 2, No. 3.

Yuzo Shimada et al., "Low Firing Temperature Multilayer Glass-Ceramic Substrate", in Proc. National Mtg. of the Institute of Electronics & Communications Engineers of Japan (1981), 110.

S. Mishigaki et al., "A New Low Temperature Fireable Ag Multilayer Ceramic Substrate Having Post-Fired Cu Conductor", (LFC-2), The International Journal for Hybrid Microelectronics, vol. 10, #2, 2nd Quarter 1987 (ISSN 0277-8270) Copyright: The International Society for Hybrid Microelectronics.

Primary Examiner—William R. Dixon, Jr.
Assistant Examiner—David M. Brunsman
Attorney, Agent, or Firm—Harvey Fendelman; Thomas G. Keough

[57] ABSTRACT

A ceramic material for electronic circuit devices is sintered at less than or equal to 1000° C. temperature. A filler material such as quartz and a glassy binder $RO-Al_2O_3-B_2O_3$ are mixed together along with an appropriate glassy binder prior to firing. RO is drawn from the group of metal oxides MgO, CaO, SrO, BaO, ZnO or CdO and the glassy binders form no more than 40 vol% of the ceramic material. The glassy binder has a suitable viscosity and other properties so that after it is mixed with the quartz filler, sintering occurs at the relatively low temperature. As a consequence, high conductivity conductors made of copper, silver and gold can be appropriately metallized prior to firing. The strength and low dielectric constant of the ceramic material make the material well adapted for ceramic substrates, thick films and the like which are used in VHSIC and VLSI applications.

2 Claims, No Drawings

GLASSY BINDER SYSTEM FOR CERAMIC SUBSTRATES, THICK FILMS AND THE LIKE

STATEMENT OF GOVERNMENT INTEREST

The invention described herein may be manufactured and used by or for the Government of the United States of America for governmental purposes without the payment of any royalties thereon or therefor.

BACKGROUND OF THE INVENTION

The high component densities, clock rates and rise times that occur with Very High Speed Integrated Circuit (VHSIC) and Very Large Scale Integrated (VLSI) devices make the design concepts of the recent past inadequate. Some of these inadequacies stem from limitations inherent in the contemporary ceramic packaging materials that are used for substrates, thick film and the like. In order to fully appreciate the capabilities of the emerging technologies, more sophisticated electrical and mechanical requirements must be taken into consideration in the overall packaging, design decision. In other words, some requirements, particularly the electronic properties of the packaging material must be factored into the finalized VHSIC design.

Two primary packaging material properties which influence circuit performance are dielectric constant and dissipation factor. Of the two, dielectric constant is by far the more important since the dissipation factor's importance increases directly with the interconnect lengths. By reducing interconnect lengths a designer may deal more directly with the problem of the keeping the dielectric constant appropriate for the intended circuit applications.

The importance of having the proper dielectric constant is that the propagation delay, $\sigma$ is affected by the dielectric constant, $\epsilon'$ and can be expressed by the relationship that it is approximately equal to the square root of $\epsilon'$. From this expression it is apparent that a significant reduction in the dielectric constant will have a useful impact on the speed at which the associated integrated circuits operate. For instance, to make a 33% decrease in signal delay, the dielectric constant must be reduced about 55% or, stated otherwise, the dielectric constant must be reduced from about 9 to 4.

A good many ceramic packaging devices including thick films and substrates are fabricated exclusively from alumina ($Al_2O_3$) based systems. These ceramics often are manufactured by solid state sintering or glassy phase sintering and pure alumina substrates (up to 99.9% vol.) are manufactured without a glassy phase binder, although there is still this smallest percentage of tramp impurity glassy phase included. One of the advantages of pure alumina substrates is the virtual absence of a glassy, phase ensuring the highest possible thermal conductivity, which approaches approximately 35 W/mK. While alumina based systems have attractively high thermal conductivities and strengths, they possess an unattractively high dielectric constant equal to about 9. Since dielectric constant is a most important consideration in VHSIC designs, the relatively high dielectric constant negatively impacts logic speed and design in terms of impedance matching. Another limitation of the $Al_2O_3$ based systems is that they must be fired at higher temperatures to promote the proper densification of the substrates. This is because in the absence of a glassy phase, firing temperatures approaching 1600° C. are necessary. Even the more common 92% alumina (which actually has about 15 vol% of glass that is intentionally incorporated) has its firing and metallization temperature at about 1500° C. The high firing temperatures, particularly in case of multilayer structures, require that the interconnecting conductors be metallized with refractory metals such as tungsten or molybdenum. As a consequence, higher line resistances must be tolerated. More desirable metals that have a higher conductivity, such as copper, silver or gold cannot be used since their continuity would be impaired during the application of the higher temperatures required for firing a substrate in which alumina is a major constituent.

Some of the contemporary developments use a dielectric filler, often $Al_2O_3$ in a major glass fraction. Usually this glass fraction is over 50 vol% and may reach the 80 vol% figure.

A number of contemporary developments is based on the use of a glassy fraction composed of the borosilicate compositions, one of which is commercially available by the Corning Glass Works in its trademarked Pyrex series. These glasses have received acceptance because they are widely available commercially, time tested and low in dielectric constant.

Most of the borosilicate glasses have only a small fraction of aluminum oxide and do not contain calcium oxide as a major phase in the glassy binder. A high volume fraction of the glassy binder has been used in a number of the contemporary compositions because the glass has a relatively high viscosity which retards thermal densification unless incorporated as the major phase. It appears that greater than 50 vol% glass is necessary with Pyrex type borosilicates to bring the firing temperature down below 1000° C. However, such a large glass fraction reduces the strength of the final material. As a consequence, it is desirable to reduce the large glass fraction. Such a reduction, however, is impossible when a low firing temperature is needed with the borosilicate glasses.

A system of glasses $CaO—BaO—Al_2O_3$ was discussed by A. E. Owen in his paper entitled "Properties of Glasses in the System" $CaO—BaO—Al_2O_3$ appearing in *Physic and Chemistry of Glasses*, volume 2, #3, June, 1961. The glasses Owen discussed are quite different in composition and most different in viscosity as compared to the Pyrex type borosilicate. The lower viscosity of the $CaO—BaO—Al_2O_3$ glasses provides a property which greatly aids sintering and this property enables the use of as little as 25 vol% in the glassy phase in this invention to enable the sintering below 1000° C. $SiO_2$ can be added to the overall composition to improve its moisture stability and was added as a minor fraction in one batch of this invention whereas the Pyrex glasses employ $SiO_2$ as a major component. A disadvantage of including $SiO_2$ as a major portion is that evidence suggests that nucleation, or devitrification of high expansion cristobalite is likely to occur. The sudden volume change of cristobalite around 200° C. would destroy circuit elements bonded to the substrate.

Other attempts have been made to develop low firing, high conductivity metallized, user-fired tape systems for fabrication of single and multilayer substrates. These systems are mostly glass based systems with dielectric fillers and have dielectric constants of approximately 8. This high dielectric constant is not suitable for the present day VHSIC and VLSI electronic circuit applications. One other system worthy of mention is a true glass ceramic system in which a glass is crystallized after densification. This system has the proportion of the glassy phase in excess of 50% in order to keep the firing temperature low. However as with the other systems, this high a percentage of the glassy phase compromises strength and reliability. The trade off of compromising strength and reliability of the substrate to accommodate lower temperature firing is made routinely by designers. This allows higher conductivity metallizations.

There is a strong need for a glassy binder which could serve to consolidate ceramic fillers at relatively low temperatures and low volume fractions. Such a glassy binder could serve not only as a glassy phase in a substrate package and multilayer applications, but in thick film applications as well where high conductivity metallization are desirable.

A continuing need exists in the state-of-the-art for a low dielectric constant of about 4, co-fired multilayered alumina compatible substrate material having a minor glass phase and which will fire below 1000° C. to allow high conductivity metallization and which does not overly compromise its inherent strength.

SUMMARY OF THE INVENTION

The present invention is directed to providing a ceramic material and the method for making same for electronic circuit devices. The material is sintered from a dielectric filler material such as quartz and a glassy binder of the formula $RO—Al_2O_2—B_2O_3$ in which RO is drawn from the group of metal oxides, MgO, CaO, SrO, BaO, ZnO, or CdO and the glassy binder is no more than 40 vol% of the ceramic material to enable sintering at or below a temperature of about 1000° C. Miner fractions of $SiO_2$ may be used.

A prime object of the invention is to provide an improved ceramic material and method of making same for the fabrication of ceramic substrates, multilayer ceramic packages, thick films, and the like.

Another object of the invention is to provide for a ceramic material suitable for high conductivity metallizations.

Still another object is to provide for an improved ceramic material and making of same in which a dielectric filler material is combined with a glassy binder of not greater than 40 vol%.

A further object is to provide for a ceramic substrate having sufficient strength and having a low dielectric constant of about 4 to make it suitable for VHSIC and VLSI applications.

Still a further object is to provide for a ceramic substrate material of low dielectric constant of about 4 and relatively low sintering temperature of about 1000° C. to allow for high conductivity metallization thereon.

Another object is to provide for a relatively high strength ceramic packaging material for electronic applications having a low dielectric constant of about 4 and relatively low sintering temperature of about 1000° C.

Still yet another object is to provide for a ceramic substrate material fabricated from a quartz filler material and not greater than 30% of a glassy binder having a high viscosity to enable sintering at a temperature of about 1000° C.

These and other objects of the invention will become more readily apparent from the ensuing specification when taken in conjunction with the appended claims.

DESCRIPTION OF THE PREFERRED EMBODIMENT

The ceramic material enables designers to more fully realize the advantages and potentials of VHSIC and VLSI applications. Specific properties of the ceramic, which was at first intended as an alumina replacement, are that the dielectric constant (DC) is equal to about 4, the thermal expansion coefficient (TEC) is equal to about 7 ppm/°C., the mechanical strength is between 20 to 40 Ksi, and that a high conductivity metallization is possible having <2 mohms/sq.

Since high conductivity metallizations of copper, silver and gold are to be employed, the lowering of the densification temperature of the ceramic material is essential. A preferred densification mechanism for this type materials is the sintering of a dielectric filler with a glassy binder. Sintering is dependent on the characteristics of the glassy binder phase such as the particle size of the materials to be densified, its surface tension and viscosity and the elapsed time during sintering. These all affect sintering, however the property most advantageously exploited for the glassy phase sintering of this invention is the relatively low viscosity of the glassy binder.

The glasses are based on the generic system $RO—Al_2O_3—B_2O_3$. RO is drawn from the group of Group II metal oxides, MgO, CaO, SrO, BaO and ZnO. These have been found to have the combination of desired properties of high electrical resistivity, low viscosity and moderately low dielectric constant and are the ideal combination of properties for a binder glass in a low firing ceramic system. Since this system is very fluid in the molten state, the desired properties of moderately low dielectric constant and low viscosity are advantageously combined with a suitable filler in the fabrication of a superior ceramic material.

One particular glass system with RO=CaO, $CaO—Al_2O_3—B_2O_3$ has been shown by A. E. Owen in the above-identified article to have a moderately low dielectric constant in the range of 5 to 6. Viscosity has been found to be very sensitive to the $CaO:Al_2O_3$ ratio. The ranges referred to in the following Table A have been found to be suitable for fabrication of the ceramic material having the desired properties.

The glassy binder system $CaO—B_2O_3—AlO_3$, often called the CABAL glasses, were selected as having high DC resistivities and unusually low viscosities at their melting temperature. Reagent grade carbonates and oxides were melted in platinum or $SiO_2$ crucibles at a temperature of about 1300° C. with periodic stirring. These CABAL glasses C1–C5 having the percentages by volume and other characteristics as indicated in Table A below were melted at the indicated temperatures, cooled and ground to a fine powder.

TABLE A

| CABAL GLASSES | | | | | | | |
|---|---|---|---|---|---|---|---|
| | Mole % | | | | Dil. Soft. | TEC ppm | DC 010 |
| Glass | $B_2O_3$ | $Al_2O_3$ | CaO | $SiO_2$ | Pt. °C. | 0200° C. | MHz |
| C1 | 76.7 | 9.3 | 14.0 | — | 575 | 4.2 | 5.2 |
| C2 | 73.3 | 13.3 | 13.3 | — | 600 | 4.0 | 5.3 |
| C3 | 66.7 | 16.7 | 16.7 | — | 640 | 3.5 | 5.9 |
| C4 | 60.0 | 20.0 | 20.0 | — | 652 | 4.0 | 6.1 |
| C5 | 46.7 | 16.7 | 16.7 | 20.0 | 659 | 3.0 | 6.1 |

The percentage of ingredients could be broadened to accommodate CaO equal to 5 to 30 mole%, $Al_2O_3$ equal to 0 to 30 mole% and $B_2O_3$ from 30 to 90 mole%. $SiO_2$ could range from 0 to 50 vol%.

A quartz filler was selected for mixing with the powdered glassy binder. Commercially available α quartz was obtained in a −325 mesh powder and water milled for 72 hours to average a particle size of 4 microns. This powdered quartz was thoroughly mixed with the powdered glassy binder in accordance with the indicated volume proportions of the following Table B. The organic binder was derived from a 4% polyethylene glycol binder solution by milling in propanol, followed by drying and screening. This organic binder was added to the glassy binder-filler mixtures before they were pressed into disks, for firing at the indicated temperature of not more than 1000° C.

TABLE B

MIXTURES AND SINTERING RESULTS

| No. | Glass | Vol % | Filler | Firing Temp. °C. | Linear Shrinkage % | DC 010 MHz |
|---|---|---|---|---|---|---|
| 1 | C1 | 30 | Quartz | 1000 | 14.6 | 4.0 |
| 2 | C2 | 30 | Quartz | 1000 | 14.0 | 3.9 |
| 3 | C3 | 30 | Quartz | 1000 | 14.3 | 4.1 |
| 4 | C4 | 30 | Quartz | 1000 | 15.7 | 4.4 |
| 5 | C5 | 30 | Quartz | 1000 | 16.7 | 4.4 |

Foil electrodes were applied to the fired disk and the dielectric constant measured (Table above). Substrates were also fabricated by tape fabrication technique. Some of the batch samples designated 1 through 5 also were shaped into other configurations, i.e. substrates, multilayer substrates, thick films or the like and various conductors were appropriately located on the composite structures which were subjected to firing temperatures from 900° C.–1000° C. The data in Table B shows that at the relatively low volume fraction of 30 vol% of the glassy binder that full density was reached during firing as noted from the linear shrinkage percentages. The glassy binder C5 having the percentage indicated in Table A showed increased shrinkage as compared to the other ceramic materials, note the second table. In the C5 glassy binder, silicon dioxide was added to improve moisture resistance. The increased silica content and its attendant elevation of viscosity has promoted greater shrinkage. This may be attributable to the increase in surface tension that silicon dioxide induces.

Although results were not set out in Tables A and B, another ceramic material was put together using a glassy binder, the same constituency as glassy binder C1. 30 vol% of the C1 glassy binder was mixed with 30 vol% of silicon dioxide and 40 vol% of a different filler, cordierite. This material with cordierite substituted for quartz and 30% of silicon dioxide showed evidence of over firing at 900° C., with a consequent aberration in dielectric constant and strength.

The glassy binder glasses throughout the RO—$Al_2O_3$—$B_2O_3$ system with and without additions of silicon dioxide and quartz filler will permit low firing, highly filled ceramic substrates, packages, co-fired multilayered boards and paste. Up to a 40 vol% glassy binder phase could be used satisfactorily and retain sufficient strength. This provides a low dielectric constant glass which has the ability to serve as a low temperature densifying phase at volume fraction levels that equate the RO—$Al_2O_3$—$B_2O_3$ glassy binder to be considered as a minor phase. Firing temperatures can range from 850° C. to 1050° C., particularly when the glass is greater than 30 vol%. 60 vol% could be used with a consequent weakening of the structures.

Useful embodiments of the indicated compositions have been made by in the form of substrates and thick film pastes. Substrates have been made using ceramic tape casting techniques. Such forms are made by suspending the mixture of glass binder powder and quartz as a liquid slurry. Slurries of the powders are formed by first dispersing the powder in a solvent in which a dispersant is pre-dissolved. The dispersant prevents agglomeration of the powders. This dispersant attaches itself to the particles during milling in the solvent. To the dispersed powder and solvent, binders and plasticizers are added. The binder's function is to hold the powders together after forming. Plasticizers allow for flexing the final formed film, while other additives provide various forming benefits, such as viscosity conditioners, etc. One such formulation is shown in Table C.

TABLE C

| TAPE CASTING FORMULATION | |
|---|---|
| 148.5 g | α Quartz |
| 54.0 g | CaO—$Al_2O_3$—$B_2O_3$ Glass |
| 4.0 g | Fish Oil (Dispersant) |
| 65.0 g | Xylene (Solvent) |
| 55.0 g | Ethanol (Solvent) |
| Mill 24 hrs. | |
| After 24 hrs., add, | |
| 16. g | Polyvinylbutyral (Binder) |
| 10. g | Polyalkylene Glycol (Plasticizer) |
| 10. g | Alkyl Phthalate (Plasticizer) |
| Mill 24 hrs. | |
| Filter through 70μ cloth. Vacuum de-air to adjust viscosity to 2200–4000 cps. Tape cast. | |

The well dispersed powder bearing slurry is then poured onto a polymeric sheet or glass. The liquid is spread to a desired thickness by a knife edge which is either drawn across the liquid, or the glass or polymeric sheet is drawn under the stationary knife edge. The process is commonly known as doctor blading.

Once the liquid has been drawn into a thick film, the solvent in the film is allowed to evaporate leaving a dried, flexible plasticized film, commonly called tape. The tape is peeled off the glass or polymeric sheet and is suitable for shaping and various post forming operations. The tapes are usually punched into the desired shape, which may or may not include via holes. The tapes may then be metallized by silk screening techniques using commercial thick film pastes. If the "green", i.e., unfired, tapes are to be laminated, via holes may be filled with metallization paste and then the layers stacked up and bonded by application of pressure and temperatures to the stack. Once final shaping, metallization and/or lamination is completed, the "green" material is ready to be fired in order to eliminate all organic phases and bring about the desired densification. Usually firing rates are adjusted so that the organic phases burn off at a rate slow enough not to disrupt the integrity of the shape.

Greater concentration of the glassy binder phase of up to 40% could be used with commensurate reductions in the percentage of filler. As a consequence of using more glass than 30 vol% a firing temperature range of 850° C. to 1050° C. could easily be accommodated.

The data shows that for the relatively low volume fraction of 30% of the glassy binder, all tested samples reached nearly full densities as inferred from the shrinkage. Greater shrinkage was observed in glass C5 where silicon dioxide has been added to improve moisture resistance and to elevate the viscosity probably by increasing the surface tension.

Thick film pastes of the glassy binder/quartz powder mixture are made in manner quite similar to the tape slurry formulation. A thick film paste begins as a paint-like slurry which is formulated to have good flow properties permitting penetration through a screen, allowing removal of the surplus above the screen height by wiping with a squeegee and further allows self-leveling without undue spreading following removal of the screen. Such pastes are ultimately thicker than tape casting slurries. They contain dispersants, binders, binder solvents, viscosity modifiers, etc. Normally, plasticizers are absent. Table D contains the formula of a thick film formulation. The paste, is applied exactly as commercial thick film formulations.

TABLE D

| TAPE CASTING FORMULATION | |
| --- | --- |
| 148.5 g | α Quartz |
| 54.0 g | CaO—$Al_2O_3$—$B_2O_3$ Glass |
| 10.0 g | Fish Oil (Dispersant) |
| 65.0 g | Xylene (Solvent) |
| 55.0 g | Ethanol (Solvent) |
| Mill 24 hrs. | |
| After 24 hrs., add. | |
| 16. g | Polyvinylbutyral (Binder) |
| 50. g | Amyl Acetate |
| Mill 24 hrs. | |
| Filter through 70μ cloth. Vacuum de-air to adjust viscosity to 10,000 cps. Silk screen. | |

For a substrate it is highly desirable to use as little glass phase as possible for strength's sake. Other applications such as thick film pastes, do not require high strength. Being thin, ≠0.001–0.002 in., they derive their stability from the substrate. Thus there is not the same incentive to lower the glassy phase. The more glassy phase, the lower the firing temperature. It is very conceivable for some applications that a thick film application might want to incorporate as much as 60 vol% glass and a substrate could go to 50 vol%.

Obviously, many modifications and variations of the present invention are possible in the light of the above teachings. It is therefore to be understood that within the scope of the appended claims the invention may be practiced otherwise than as specifically described.

I claim:

1. A ceramic material having a dielectric constant of about four for the fabrication of electronic circuit devices including a dielectric filler material of quartz and a glassy binder of the formula RO—$Al_2O_3$—$B_2O_3$ in which RO is CaO in mole% from 13.3 to 20, $Al_2O_3$ in mole% from 9.3 to 20.0 and $B_2O_3$ in mole% from 46.7 to 76.7 for sintering at less than or equal to 1000 degrees C and the glassy binder is no more than 40 vol% of the ceramic material.

2. A ceramic material according to claim 1 which has the physical properties that allow it to be appropriately shaped to be metallized with high conductivity conductors made from copper, silver or gold before sintering.

* * * * *